United States Patent [19]

Braden et al.

[11] Patent Number: 5,132,773
[45] Date of Patent: Jul. 21, 1992

[54] CARRIER RING HAVING FIRST AND SECOND RING MEANS WITH BONDED SURFACES

[75] Inventors: Jeffrey S. Braden, Livermore; Matthew D. Penry, Modesto, both of Calif.

[73] Assignee: Olin Corporation, New Haven, Conn.

[21] Appl. No.: 651,686

[22] Filed: Feb. 6, 1991

[51] Int. Cl.⁵ .................... H01L 23/04; H01L 23/06; H01L 23/08
[52] U.S. Cl. ........................................ 357/70; 357/74; 357/68
[58] Field of Search .............. 357/74, 72, 70, 68; 437/209, 211

[56] References Cited

U.S. PATENT DOCUMENTS

| | | | |
|---|---|---|---|
| 4,218,701 | 8/1980 | Shirasaki | 357/70 |
| 4,696,526 | 9/1987 | Newton et al. | 439/68 |
| 4,701,781 | 10/1987 | Sankhagowit | 357/70 |
| 4,706,811 | 11/1987 | Jung et al. | 206/331 |
| 4,796,080 | 1/1989 | Phy | 357/70 |
| 4,812,421 | 3/1989 | Jung et al. | 357/70 |
| 4,837,184 | 6/1989 | Lin et al. | 357/74 |
| 4,859,632 | 8/1989 | Lumbard | 437/209 |
| 4,897,508 | 1/1990 | Mahulikar et al. | 174/52.4 |
| 4,899,207 | 2/1990 | Hallowell et al. | 357/70 |
| 4,939,316 | 7/1990 | Mahulikar et al. | 174/52.4 |
| 4,967,260 | 10/1990 | Butt | 357/70 |
| 5,001,544 | 3/1991 | Boucard | 357/70 |
| 5,036,381 | 7/1991 | Lin | 357/70 |

OTHER PUBLICATIONS

Electronic Materials Handbook, vol. 1, *Packaging*, (1989), at pp. 209-210, 240-241.
JEDEC Solid State Product Outlines entitled *Tapepak ® Molded Carrier Ring Family*, pp. 2 of 19-7 of 19.

*Primary Examiner*—Andrew J. James
*Assistant Examiner*—S. V. Clark
*Attorney, Agent, or Firm*—Gregory S. Rosenblatt; Paul Weinstein

[57] ABSTRACT

A two-piece carrier ring is provided. First and second rings are affixed to opposing sides of the exterior portion of a leadframe and protect the leads from distortion. The rings are molded prior to bonding to the leadframe so that the rings may be formed from a wide variety of plastics. The premolded rings are polymerized prior to bonding preventing distortion of the leads by shrinking of the rings.

12 Claims, 3 Drawing Sheets

1

CARRIER RING HAVING FIRST AND SECOND RING MEANS WITH BONDED SURFACES

BACKGROUND OF THE INVENTION

The present invention relates to molded carrier rings for electronic packages. More particularly, the invention relates to a two piece plastic ring which surrounds the external leads of a leadframe preventing distortion.

Electronic packages for housing integrated circuit devices such as silicon based semiconductor circuits, called chips, are increasingly required to have a high density of electrical interconnections. One high density package is known as the quad flat pack. The package is square or rectangular with a plastic, ceramic or metal body having leads approaching from four sides. The quad package has a metal leadframe with a central paddle for chip attachment. In one method of assembly, the chip is attached using a silver filled epoxy or solder. The chip is then electrically connected to the leadframe by wire bonding or tape automated bonding. From about 10 to 100 leads extend from each side of the central pad resulting in package lead counts of 40 to 400 leads or more. The centrally positioned paddle, chip and inner leads are then encapsulated in an epoxy molding resing or between metallic base and cover components with outer lead ends extending from the package body. Transfer molding is usually used. The low viscosity of the molding resins minimizes damage to bond wires.

The leads are manufactured from thin gauge copper, a copper alloy or an iron-nickel alloy. With a thickness of from 0.001 to 0.010 inches and typically about 0.005 to 0.006 inches, the leads are much more fragile than the leads of a conventional dual-in-line (DIP) package which has leads with a thickness of 0.010 inches. The leads are susceptible to damage during device testing and mounting.

To minimize lead distortion during shipping, handling and testing, a carrier ring is molded around the external ends of the leads. As disclosed in U.S. Pat. No. 4,701,781 to Sankhagowit, a molded carrier ring and package body are simultaneously encapsulated by transfer molding of an epoxy resin. The ring remains in place during testing and shipping preventing distortion of the leads.

The molded carrier ring is effective, but suffers from several limitations. The outer leads are encapsulated at the same time as the chip, paddle, and inner leads. This mandates that the molded carrier ring be made from the same molding resin as the semiconductor package body. To change encapsulation resin requires a two step process adding to the tooling and equipment costs, increasing processing costs and reducing the yield.

To prevent non-uniform flow of resin in both the package body and carrier ring, dam bars are required between each lead at the outer edge of the package body and also at the inner edge of the molded carrier ring. Both sets of dam bars must be trimmed to provide electrical isolation between leads. The molded carrier ring doubles the number of dam bars which must be removed. The process for removing dam bars involves the use of highly detailed punch tools which are expensive to build and maintain.

The epoxy resins used to encapsulate semiconductor devices shrink as the resin polymerizes, typically by about 0.4%. If the quad flat pack or the ring is not symmetric with equal resin thickness above and below the frame, shrinkage may warp the leadframe. Resin shrinkage also distorts lead-to-lead spacing, or pitch. The variation in pitch is a problem for dam bar removal, electrical testing and board mounting. The variations in pitch become a more significant problem with higher lead count and finer pitch leadframes.

In a metal quad flat pack, such as disclosed in U.S. Pat. No. 4,939,316 to Mahulikar et al, the quad leadframe is disposed between metallic base and cover components and bonded to both with an epoxy adhesive. Dam bars are not required. The use of a carrier ring molded about the leadframe requires the addition of dam bars to the leadframe. The addition of dam bars adds the process step of severing after encapsulation, increasing the number of processing steps and adding to tooling costs.

SUMMARY OF THE INVENTION

It is an object of the invention to provide a carrier ring which prevents distortion of the outer lead ends of a leadframe while overcoming the disadvantages of a molded carrier ring. It is a feature of the invention that the carrier ring is provided as two parts which are joined together with the leadframe disposed between. An advantage of the invention is that different plastics may be used to encapsulate the semiconductor device and to form the carrier ring. Plastics which are not suitable for encapsulating the device may be used to form the carrier ring. A further advantage of the invention is that the rings may be formed by injection molding, rather than transfer molding.

Yet another advantage of the invention is that dam bars are not required. Only one set of dam bars, those restraining the package body, must be severed in an encapsulated plastic package. No dam bars need be severed in a metal package or a ceramic package. Yet another advantage of the invention is that any yield loss in fabricating the carrier rings occurs before the rings are attached to the leadframe. Defective rings are removed from the system before a leadframe and semiconductor device must be scrapped. Still another advantage of the invention is that the carrier ring fully polymerizes before attachment to the semiconductor device. Shrinkage of the carrier ring is complete before attachment and warping of the assembly is minimized. Low shrinkage plastics not suitable for encapsulating a semiconductor device may be used.

In accordance with the invention, there is provided a molded carrier ring for supporting a plurality of external leads of a semiconductor package. The molded carrier ring has a first ring and a second ring both defining an aperture and having a bonding surface. A means is provided to bond the first ring to the second ring with the plurality of external leads disposed therebetween.

The above stated objects, features and advantages will become more apparent from the specification and drawings which follow.

DETAILED DESCRIPTION OF THE INVENTION

Figure 1:
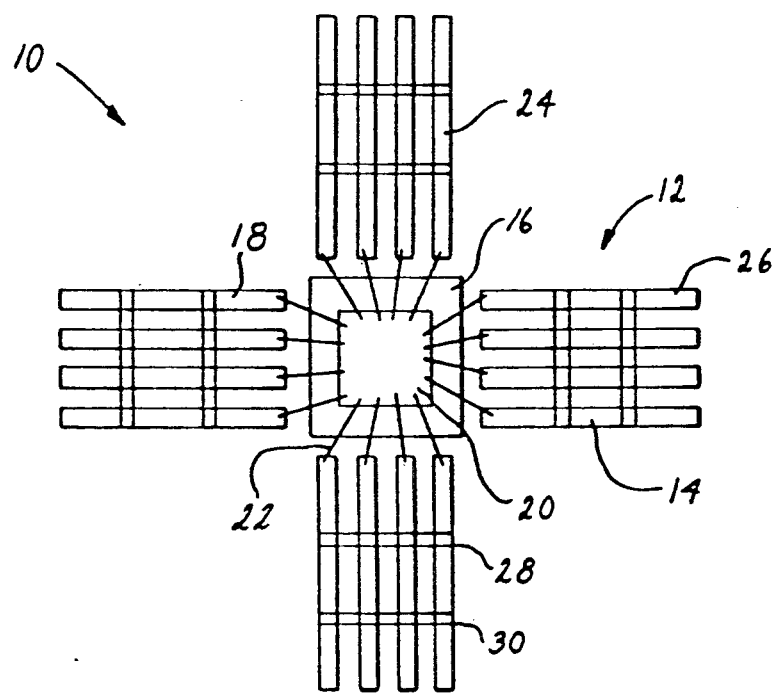
FIG. 1 shows in top planar view an electronic device electrically interconnected to a quad leadframe as known in the prior art.

FIG. 1 shows in top planar view an unencapsulated package assembly 10 for use in a quad flat package as known in the prior art. The unencapsulated package assembly 10 includes a leadframe 12. The leadframe 12 has a plurality of leads 14 disposed about a centrally position chip attach pad 16. In a quad configuration, the leads 14 are disposed on four sides of the centrally positioned chip attach pad. Other package configurations have leads disposed from a lesser number of sides. A DIP package has leads positioned on two opposing sides of the centrally positioned chip attach while a single-in-line package (SIP) has leads disposed on one side. The two piece carrier ring is suitable for any lead configuration. The leadframe 12 is manufactured from an electrically conductive material such as copper, a copper alloy, or an iron nickel alloy such as Alloy 42 (42% nickel, remainder iron). One preferred copper alloy is C194 (nominal composition 2.1–2.6% by weight Fe, 0.015–0.15% P and the balance Cu). In a quad package, the lead thickness is about 6 mils, while in a DIP or SIP package, the lead thickness is about 10 mils. Due to stamping and etching constraints, the lead-to-lead pitch is limited by the thickness of the leadframe 12. The higher pitch quad leadframes require a correspondingly thinner leadframe which is more prone to lead distortion.

The leads 14 have interior ends 18 for electrical interconnection to a semiconductor device 20. Electrical connection between the device 20 and the interior ends 18 of leads 14 is by wire bonds 22. Alternatively, electrical interconnection may be by thin strips of copper foil known as tape automated bonding.

The leads 14 include a central portion 24. After severing of the carrier ring, the central portion 24 forms the outer lead portion which is electrically connected to an external device, such as by being soldered to a printed circuit board. The external portion 26 of the leads 14 is encapsulated by the carrier ring as will be described below.

A first set of dam bars 28 bridges the leads 14 at the interface of the interior ends 18 and central portion 24. A second set of dam bars 30 bridges the leads 14 at the interface of the central portion 24 and external portion 26. The first set of dam bars 28 and second set of dam bars 30 are leadframe material which has not been removed by stamping or etching. The dam bar bridges the leads and forms a dam to prevent the flow of molding resin during encapsulation.

After the semiconductor device 20 is bonded to the centrally positioned chip attach pad 16 such as with an electrically conductive epoxy die attach adhesive or a low temperature solder, wire bonds 22 electrically connect the semiconductor device 20 to the leads 14. The package assembly 10 is then encapsulated with a molding resin such as a thermosetting epoxy. To protect the fragile wire bonds 22, transfer molding is usually employed. The package assembly 10 is placed in a mold having a centrally positioned cavity with peripheral dimensions (length and width) equal to that defined by the first set of dam bars 28. The mold contains a second cavity circumscribing the first cavity located about the external portion 26 of the leads. The molding resin is heated to a temperature at which its viscosity is sufficiently low to flow into the molding cavities and to avoid displacement of the wire bonds 22. After transfer mold encapsulation, the plastic quad flat package is complete.

Figure 2:
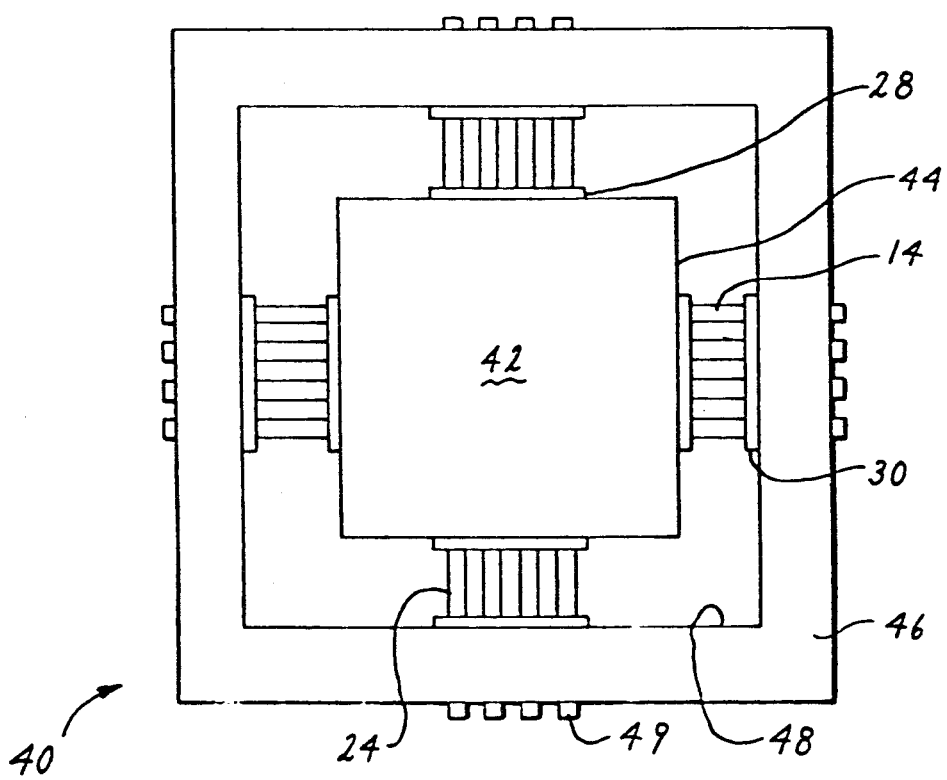
FIG. 2 shows in top planar view a plastic quad flat package with carrier ring as known in the prior art.

FIG. 2 illustrates a molded plastic quad flat package 40 as known in the art. The centrally positioned chip attach pad, the interior ends of the leads, the semiconductor device and wire bonds are within molded plastic body 42. The planarity of the perimeter 44 of the molded plastic body 42 is maintained by the first set of dam bars 28. The first set of dam bars 28 prevent the flow of molding resin into the spaces between leads 14.

The external portion of the leads is encapsulated within a molded carrier ring 46. The planarity of the interior edge 48 of the carrier ring 46 is maintained by the second set of dam bars 30. The package and ring are severed from a leadframe strip. The tips 49 of the external portion of the leads extend beyond the carrier ring 46 to facilitate testing of the package without lead damage. Before the plastic quad flat package 40 may be connected to external circuitry, the first 28 and second 30 set of dam bars must be severed to electrically isolate the leads 14. Additionally, carrier ring 46 is excised from the leads 14 freeing central portions of the leads 24 for electrical connection.

Figure 3:
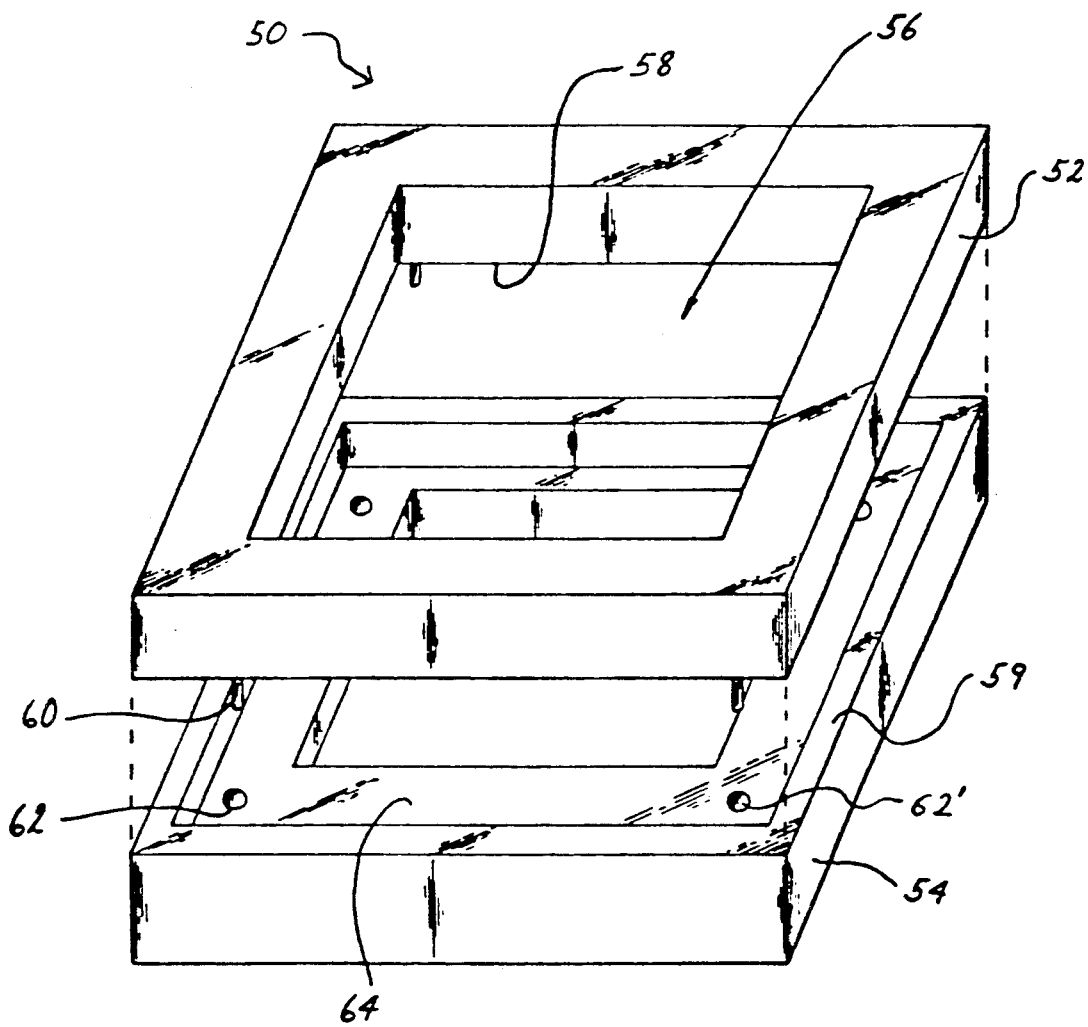
FIG. 3 shows in isometric view a two piece carrier ring in accordance with the invention.

FIG. 3 shows in isometric view a two-piece carrier ring 50. The two-piece carrier ring 50 has a first ring 52 and a second ring 54. Preferably, one ring is slightly larger than the second. The slight difference in size compensates for any misalignment between the rings so a rectangular profile is maintained. The larger ring is from about 0.004 inches to about 0.010 inches larger than the smaller ring. Preferably, the ring is from about 0.007 to about 0.009 larger. While either ring may be larger, the planar profile is typically a top planar view and the ring on the top side of the package should be larger. The top side of the package is defined as the direction the leads are formed subsequent to severing of the carrier ring 50.

The first 52 and second 54 carrier rings define an aperture 56. To compensate for misalignment and to present a square top planar profile, one ring defines a slightly smaller aperture than the other. The "top" ring may have the slightly smaller aperture to ensure a square planar profile. The smaller aperture is preferably from about 0.007 to about 0.009 smaller, in length and width, than the larger aperture.

A contact ridge 58 is preferably present on one or both molded carrier rings. The contact ridge 58 is a raised area on the surface of the first ring 52 which is to be bonded to the second ring 54. A contact ridge 59 may also be formed on the second ring 54. The contact ridges assure the leadframe contacts the rigid plastic carrier ring 50 as opposed to an adhesive. The resultant metal to hard plastic contact provides a well-defined, consistent surface to serve as a forming anvil for the external lead tips which are formed against the ring to form external contact pads.

The height of the contact ridges 58, 59 is about equal to the thickness of an adhesive used to bond the first and second rings together. Preferably, the height of the contact ridge is from about 0.002 inches to about 0.010 inches, and more preferably, from about 0.004 inches to about 0.006 inches. Of course, if an adhesive is not used to bond the two rings, the required ridge height or location may be different or excluded altogether.

To facilitate alignment of the first 52 and second 54 rings, a locating means may be employed. One such locating means is a plurality of pins 60 designed to mate with matching receptacle holes 62. Any suitable alignment means may be employed.

The first ring 52 and second ring 54 are manufactured from a suitable polymer characterized by high strength and good molding ability. To minimize price, the polymer is preferably injection moldable. The polymer should have low shrinkage and warpage during polymerization. An epoxy is suitable. More preferred polymers include polyethersulphone (PES) such as VICTREX manufactured by ICI, RYTON manufactured by Philips Petroleum and polyetherimide (PEI). PES is most preferred. Any of the polymers may include fillers such as a glass to influence the properties of the ring or to facilitate molding.

A package assembly is disposed between the first 52 and second 54 carrier rings. The first and second rings are then bonded together. One means of bonding is to dispose a polymer adhesive preform 64 between the rings. The adhesive preform 64 is selected to be any polymer which adheres strongly to the contact rings. One suitable adhesive is an epoxy such as Ablefilm 550 manufactured by Ablestik Laboratories. To facilitate alignment of the polymer adhesive preform 64, receptacle holes 62' are formed in the adhesive to align with both alignment pins 60 and receptacle holes 62.

Two polymer ring preforms, one for the first ring and one for the second ring may be utilized. Rather than a preform ring, liquid adhesives and pastes may be used. The ring may require preparatory treatment prior to bonding with the adhesive. One suitable treatment is a solvent clean. A solvent, such as acetone, is used to remove contaminants such as mold release compounds which interfere with bonding. The solvent also roughens the surface of the rings to improve adhesion.

Figure 4:
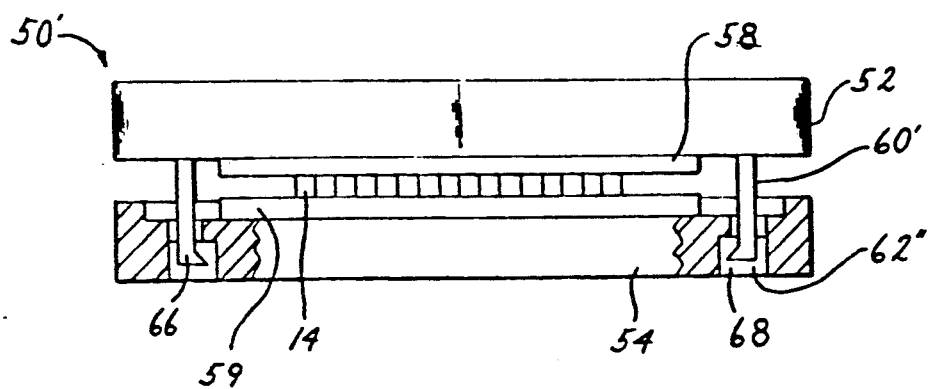
FIG. 4 shows in cross-sectional representation a reusable carrier ring in accordance with an embodiment of the invention.

Bonding of the first 52 and second 54 carrier rings is not limited to an adhesive. Ultrasonic welding and heat staking may be used. A latching mechanism as shown in cross-sectional representation in FIG. 4 is another preferred method. The alignment pins 60' have an expended termination end 66 which mechanically locks within an expanded region 68 of the receptacle holes 62''. The external portion of leads 14 are locked between the first ring 52 and second ring 54. In addition to the advantages of the two-piece carrier ring discussed above, this embodiment is reusable.

After severing of the leads 14, the alignment pins 60' are disengaged from the expanded region of the receptacle holes 68 permitting reuse of the rings.

Figure 5:
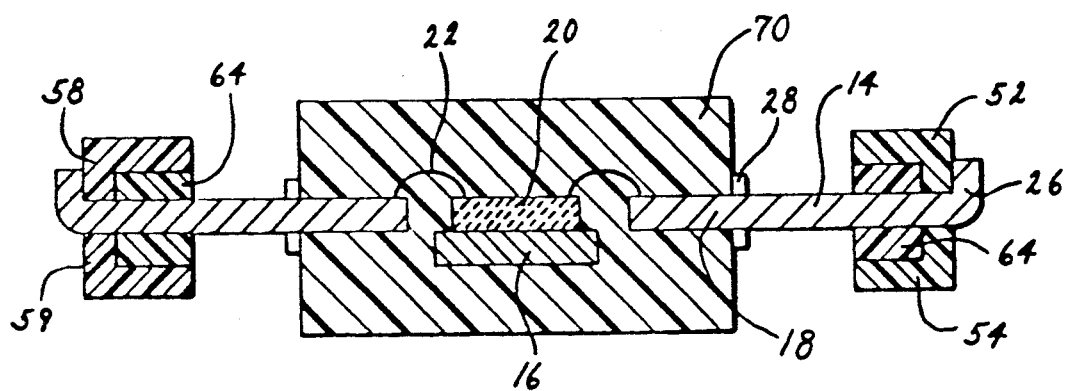
FIG. 5 shows in cross-sectional representation a plastic quad flat package incorporating the carrier ring of the invention.
Figure 6:
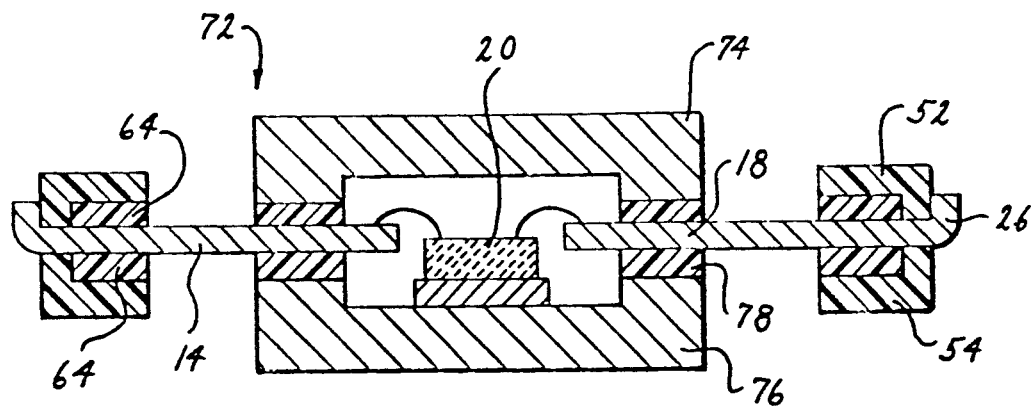
FIG. 6 shows in cross-sectional representation a metal quad flat package incorporating the carrier ring of the invention.

FIGS. 5 and 6 show in cross-sectional representation the assembly of electronic packages including the two-piece carrier ring. In FIG. 5, a molded plastic package body 70 encapsulates a semiconductor device 20, wire bonds 22, a centrally positioned chip attach pad 16 and interior ends of the leads 18. The molded plastic package body 70 is formed from an epoxy such as novolac. One preferred epoxy is a silica filled novolac manufactured by Dexter Hysol known as MG36F. The external portion of the leads 26 are supported by a first carrier ring 52 and a second carrier ring 54. Contact ridges 58, 59 ensure the hard plastic carrier ring supports the exterior leads 26 and provides an anvil for forming. A polymer adhesive preform 64 bonds both the first ring 52 to the second ring 54. The adhesive also bonds the first 52 and the second 54 rings to the exterior portion of the leads 26.

The bonding of the first and second carrier rings to the external leads 26 is independent of the molding of plastic body 70 around the semiconductor device. The molded carrier ring may be bonded to the external leads, either at the same time as the molding of plastic package body 70 or before or after the molding of the package body. There is no requirement that the first ring 52 and second ring 54 be formed from the same polymer as the molded plastic package body 70. The first ring 52 and second ring 54 are fully polymerized. All shrinkage occurs before bonding to the external leads 26. The assembly of the carrier ring does not distort the leads.

A first set of dam bars 28 is required to prevent the flow of the molded plastic package body 70 between the leads 14. However, the need for a second set of dam bars located at the interface of the carrier ring and the leads has been eliminated.

FIG. 6 shows in cross-sectional representation a metal electronic package 72 employing the two-piece carrier ring of the invention. The metal electronic package 72 has a metallic cover component 74 and metallic base component 76. Both the cover component 74 and base component 76 are usually formed from a high thermal conductivity metal or metal alloy such as copper, aluminum or their alloys. The leads 14 are disposed between the cover component 74 and base component 76. The interior ends 18 of the leads 14 are bonded to both the cover component and base component by an adhesive 78 or a sealing glass. Either simultaneously with, prior to, or subsequent to encapsulation of the semiconductor device 20 within the metallic cover component 74 and base component 76, the first ring 52 and second ring 54 are bonded to the external portion of the leads 26. In this embodiment, no dam bars are required.

While the invention has been described in terms of metal and plastic quad packages, other package designs requiring lead protection are within the scope of the invention. Such designs include but are not limited to CERDIP, hybrid and ceramic quad packages.

The patents set forth in this application are incorporated by reference in their entireties.

It is apparent that there has been provided in accordance with this invention a two-piece carrier ring which satisfies the objects, means and advantages set forth hereinabove. While the invention has been described in combination with the embodiment thereof, it is evident that many alternatives, modifications and variations will be apparent to those skilled in the art in light of the foregoing description. Accordingly, it is intended to embrace all such alternatives, modifications and variations as fall within the broad scope of the appended claims.

We claim:

1. A carrier ring for supporting the external leads of a semiconductor package, comprising:
    a first ring defining a first aperture and having a first bonding surface;
    a first ridge formed on said first bonding surface and circumscribing said first aperture;
    a second ring defining a second aperture and having a second bonding surface; and a means for affixing said first bonding surface to said second bonding surface with at least a portion of said external leads disposed therebetween with first ridge in direct contact with said external leads.

2. The carrier ring of claim 1 wherein a second ridge circumscribing said second aperture is formed on said second bonding surface and in direct contact with said external leads.

3. The a carrier ring of claim 2 wherein said first and second ridges extend from about 0.002 to about 0.010 inches above said first and second bonding surfaces.

4. The carrier ring of claim 3 wherein said first and second ridges extend from about 0.004 to about 0.006 inches above said first and second bonding surfaces.

5. The carrier ring of claim 4 wherein said first ring and said second ring are formed from a moldable polymer resin.

6. The carrier ring of claim 5 wherein said moldable polymer resin is selected from the group consisting of epoxy, polyethersulphone, Ryton and polyetherimide.

7. The carrier ring of claim 6 wherein said injection moldable polymer resin is polyethersulphone.

8. A carrier ring for supporting the external leads of a semiconductor package, comprising:

a first ring defining a first aperture and having a first bonding surface;

a second ring defining a second aperture having a second bonding surface;

a plurality of alignment pins in said first ring and a plurality of mating receptacle holes in said second ring; and a means for affixing the bonding surface of said first ring to the bonding surface of said second ring with at least a portion of said external leads disposed therebetween.

9. The carrier ring of claim 8 wherein said means for affixing said first bonding surface to said second bonding surface is an epoxy preform having a plurality of receptacle holes matching the receptacle holes in said second ring.

10. The carrier ring of claim 8 wherein said means for aligning and affixing is mechanical locking.

11. The carrier ring of claim 10 wherein said mechanical locking means comprises a plurality of pins formed in said first ring and a plurality of mating receptacle holes formed in said second ring.

12. The carrier ring of claim 11 wherein said alignment pins have expanded termination ends and said receptacle holes have expanded regions to accept said expanded termination ends.

* * * * *